United States Patent [19]

Lee et al.

[11] Patent Number: 5,483,461
[45] Date of Patent: Jan. 9, 1996

[54] ROUTING ALGORITHM METHOD FOR STANDARD-CELL AND GATE-ARRAY INTEGRATED CIRCUIT DESIGN

[75] Inventors: Kaiwin Lee; Lu Chung, both of Sunnyvale; Chin-Hsen Lin, Milpitas; Yuh-Zen Liao, Saratoga; Stephen Wuu, Sunnyvale, all of Calif.

[73] Assignee: ARCSYS, Inc., Sunnyvale, Calif.

[21] Appl. No.: 74,961

[22] Filed: Jun. 10, 1993

[51] Int. Cl.⁶ ................................. G06F 17/50
[52] U.S. Cl. .......................... 364/490; 364/489
[58] Field of Search .................. 364/488, 489, 364/490, 491, 578; 395/600

[56] References Cited

U.S. PATENT DOCUMENTS

| | | | |
|---|---|---|---|
| 5,187,671 | 2/1993 | Cobb | 364/490 |
| 5,208,759 | 5/1993 | Wong | 364/491 |
| 5,231,589 | 7/1993 | Itoh et al. | 364/490 |
| 5,272,645 | 12/1993 | Kawakami et al. | 364/491 |
| 5,331,572 | 7/1994 | Takahashi | 364/491 |
| 5,353,235 | 10/1994 | Do et al. | 364/491 |
| 5,369,596 | 11/1994 | Tokumaru | 364/491 |

OTHER PUBLICATIONS

"A New Routing Region Definition and Ordering Scheme Using L-Shaped Channels" by Dai et al., IEEE Proceeding of ISCAS 1985, pp. 29-30.

"A Routing Program Applicable to Various Chip Structure of Gate Arrays" by Terai et al, Joho Shori Gakkai Ronbunshi, vol. 25, No. 3, May 1984, pp. 357-364.

"A New Two-Dimensional Routing Algorithm" by Chi-Ping Hsu, IEEE 19th Design Automation Conf., 1982, pp. 46-50.

Takashi, Fujii, et al., "A Multi-Layer Channel Router with New Style of Over-the-Cell Routing," Proceedings of the 29th ACM/IEEE Design Automation Conference, 1992, pp. 585-588.

*Primary Examiner*—Vincent N. Trans
*Attorney, Agent, or Firm*—Thomas E. Schatzel

[57] ABSTRACT

An electronic design automation tool embodiment of the present invention comprises a five step process. In a first step, for each pin-master of arbitrary shape in a cell-master a pin access direction is identified, a region in which placing a via will connect a pin to a metal layer, and cause no design rule violation to other pin-masters, is physical bounded on the surface of a chip. Such a region is defined to be a "via-region" of the pin-master. In a second step, at least one "via-spot" within each via-region is identified that violates no design rules if vias are placed at these points. In a third step, vias are placed on each cell instance according to their via-spots. In a fourth step, a "maze-routing" is done to connect the neighboring same net pins by metal-1. In a fifth step, the vias on the pins connected by the maze-router are removed, leaving only one via on a pin if the connection for a current net is not complete.

14 Claims, 4 Drawing Sheets

ROUTING ALGORITHM METHOD FOR STANDARD-CELL AND GATE-ARRAY INTEGRATED CIRCUIT DESIGN

BACKGROUND OF THE INVENTION

1. Field of the Invention

The present invention relates generally to automatic integrated circuit placement and routing tools, and more particularly to routing algorithms for standard-cell and gate-array design.

2. Description of the Prior Art

Takashi Fujii, et al., describe in "A Multi-Layer Channel Router with New Style of Over-the-Cell Routing," Proceedings of the 29th ACM/IEEE Design Automation Conference, 1992, pp. 585–588, a style of over-the-cell routing, where a cell structure is introduced. Recent advances in manufacturing technology make it possible to use three or four layers of interconnections in the fabrication of semiconductor devices (chips). In a "standard cell" approach, extending channels to handle multi-layered regions is necessary. Several prior art multi-layer channel routers have been developed that rely on high-speed processing for channel routing. In order to reduce channel heights, over-the-cell channel routers have been developed in which their routing models include terminals that have been limited to being placed on outlines of the cells. Thus, the routing region is divided into two regions, e.g., channels and regions over the cells. Since such routers should be applied to each of regions individually, the results depend on the selection of nets to be routed over the cells. This selection is a key challenge.

Takashi Fujii, et al., propose an over-the-cell routing where a cell structure is introduced that makes maximum use of the available cell regions. Terminals exist not only on the top and bottom edges of cells but also around the horizontal center line. Takashi Fujii, et al., regard the region between the central terminals of the upper and lower cell rows as an expanded channel. The router handles that region as a group, where connections to central terminals are achieved while avoiding same metal layer obstacles in the cells. Since it is not necessary to preliminarily select a set of nets which will run over the cells, their router globally performs the routing with a minimal channel height. It is a goal of the routing to shorten the length of polysilicon wires, suitable for high-performance chips. Experimental results are said to show that their router achieves a second objective of size reduction. The length of polysilicon wires is reported to be substantially shortened, as compared with those not considering the polysilicon terminals.

It is typically assumed that four layers are available for routing, e.g., a polysilicon layer and three metal layers: metal-1, metal-2 and metal-3. The polysilicon layer, metal-1, metal-2 and metal-3, are all used for vertical and horizontal wiring. For each layer, there is an imaginary grid system superimposed over the region to be routed. Wires preferably are routed to run along the grid lines in a rectilinear fashion, in order to reduce the number of variables that would be generated by runs that could be at an infinite number of places. An electrical connection between two wires on adjacent layers is implemented with a "via". Such vias are typically placed on the intersections of grid lines for the layers to be connected, again to reduce the number of variables, which speeds a solution.

Takashi Fujii, et al., introduce a cell structure in which obstacles may exist in opposite ends of a cell. An exemplary cell (in the cited article) has the shape of a rectilinear polygon. Terminals are located on a perimeter of the cell and around a horizontal center line. Equi-potential terminals are allowed to be only on a common vertical column. Terminals around a center line are referred to as "central terminals". Polysilicon layer-terminals exist only on the perimeter of the cell. All of the central terminals are of metal-2. A metal-3 wire is allowed to run along any of the metal-3 grid lines, since metal-3 is typically not used in a cell layout. Metal-2 wire is routed while avoiding metal-2 obstacles.

Takashi Fujii, et al., consider an "expanded channel" routing region, which is defined to be a maximal rectilinear polygon surrounding the central terminals and horizontal center lines in upper and lower cell rows. A lower half of the upper cell row is referred to as a first over-the-cell region. And an upper half of the lower cell row is referred to as a second over-the-cell region. In such over-the-cell regions, only metal-2 and metal-3 wires can be used. The grid lines of metal-1 and metal-3 are restricted to a single direction and are referred to as "tracks". The grid lines of polysilicon layer and metal-2 are restricted to an orthogonal direction and are referred to as "columns". The partial grid lines of metal-2, included in the cell regions, are referred to as the "cell columns". The partial grid lines of metal-3, included in the cell regions, are referred to as the cell tracks.

The routing problem for an expanded channel is different from a conventional channel. There may exist obstacles in the routing region. The shape of the expanded channel is not rectangular, since the central lines are not aligned horizontally. Metal-1 and metal-3 can be used for horizontal wires in the conventional channel, however only metal-1 can be used in the over-the-cell region. Polysilicon terminals are located inside the expanded channel. The grid interval of metal-1 in the over-the-cell region need not be equal to one in the conventional channel.

In one example of the prior art, routing for an expanded channel includes the steps of doing a specification of a channel, routing from central terminals, changing polysilicon terminals to metal-2, and track assignment. In the first step, the expanded channel is defined, based on the cell data. The second step performs the connections to central terminals, avoiding obstacles in the cells. In the third step, the polysilicon wires connecting to polysilicon terminals are routed to metal-2 wires, for as many polysilicon layer-terminals as is possible. This layer changing is achieved by using a pattern which is a best-fit of several patterns. The changing is required to make maximum use of metal-3 tracks, since a metal-2 wire can connect to a metal-3 wire only with a via. As a result of such changing, the length of wires is shortened. According to inherent vertical constraints, horizontal wires of subnets are assigned to tracks of metal-1 and metal-3 in the fourth step.

In order to make maximum use of the over-the-cell regions, Takashi Fujii, et al., introduced a cell structure in which terminals are located around a horizontal center line. The proposed router processes an expanded channel between central terminals in an upper cell row and ones in a lower cell row. Their experimental results indicated to them that such a router is effective in reducing a die size and can shorten the length of polysilicon wires.

In the prior art, cell pins have to be on metal-2, and have to be placed manually by a user. Such metal-2 pin positions are not instance based. Therefore, unused metal-2 pins can result and become a blockage to other signal connections. By avoiding such blockages, the connection lengths and the chip area can be reduced. Unused metal-2 pins also have the undesirable affect of introducing excess capacitance to a chip design.

SUMMARY OF THE INVENTION

It is therefore an object of the present invention to provide an electronic design automation tool for the automatic routing of metal layers in a standard cell chip design.

It is a further object of the present invention to provide an electronic design automation tool that eliminates unnecessary vias or poly-contacts in a chip design.

It is another object of the present invention to provide an electronic design automation tool that can reduce the ultimate area required by a chip.

Briefly, an electronic design automation tool embodiment of the present invention comprises a five step process. In a first step, for each pin-master in a cell-master, a region is extracted and the pin access direction is identified by the program in which placing a via connection to a pin and metal layers will allow direct access of the pins from top or bottom and cause no design rule violations to other pin-masters. The region is physically bounded on the surface of a chip. Such a region is a "via-region" on the pin-master. If the via region is empty for the pin master, vertical wires which will not cause design rule violations to other pins are added at the metal-2 pitch or one-half the metal-2 pitch position and vias are placed at the end of the wires to allow a direct access of the pin by the router. In a second step, at least one "via-spot" within each via-region is identified that violates no design rules if vias are placed at these points. A first attempt at identification inspects points along metal-2-pitch lines and half metal-2-pitch lines in the via-region. The via-spots which have a maximum number of spots on metal-2-pitch lines and half metal-2-pitch lines are preferred. In cases where a via spot cannot be found automatically, a manual addition of the via spots is possible with the editor. In a third step, vias are placed on each cell instance according to their via-spots. For each cell instance, a two via-spot combination associated with it's cell-master is found where a first combination (c1) has a maximum number of via-spots (n1) on metal-2-pitch lines and a second combination (c2) has a maximum number of via-spots (n2) on half-metal-2-pitch lines. If n1 is greater than or equal to n2, then vias are placed at the via-spots defined by c1, otherwise the cell instance is shifted, e.g., to the left, if possible, and the vias are placed at the via-spots defined by c2. In a fourth step, a "maze-routing" is done to connect the neighboring same net pins by metal-1. In a fifth step, the vias on the pins connected by the maze-router are removed, leaving only one via on a pin if the connection for a current net is not complete.

An advantage of the present invention is that an electronic design automation tool is provided in which a metal-2 via is placed onto pins automatically on an as-needed, instance basis and each pin access direction is automatically identified.

Another advantage of the present invention is that an electronic design automation tool is provided in which pin instances are originated from a common pin-master and can have metal-2 vias that are placed at a variety of otherwise fungible locations to optimize for the routing.

An advantage of the present invention is that an electronic design automation tool is provided in which metal-2 vias are not blindly added whenever the particular pins can be connected to other pins by metal-1. Eliminating unnecessary metal-2 vias affords more room for other interconnection by metal-2 and can therefore reduce the area of a chip.

A further advantage of the present invention is that an electronic design automation tool is provided which produces chips with reduced parasitic capacitances that run faster and have improved yield. An advantage of the present invention is that an electronic design automation tool is provided which does not require metal-2 pins. Metal-2 is put on pin on an instance basis, leaving more room for routing on the metal-2 layer.

An advantage of the present invention is that an electronic design automation tool is provided which can automatically drop a via at a different spot in different cell instances to optimize routing.

These and other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENT

Figure 1:
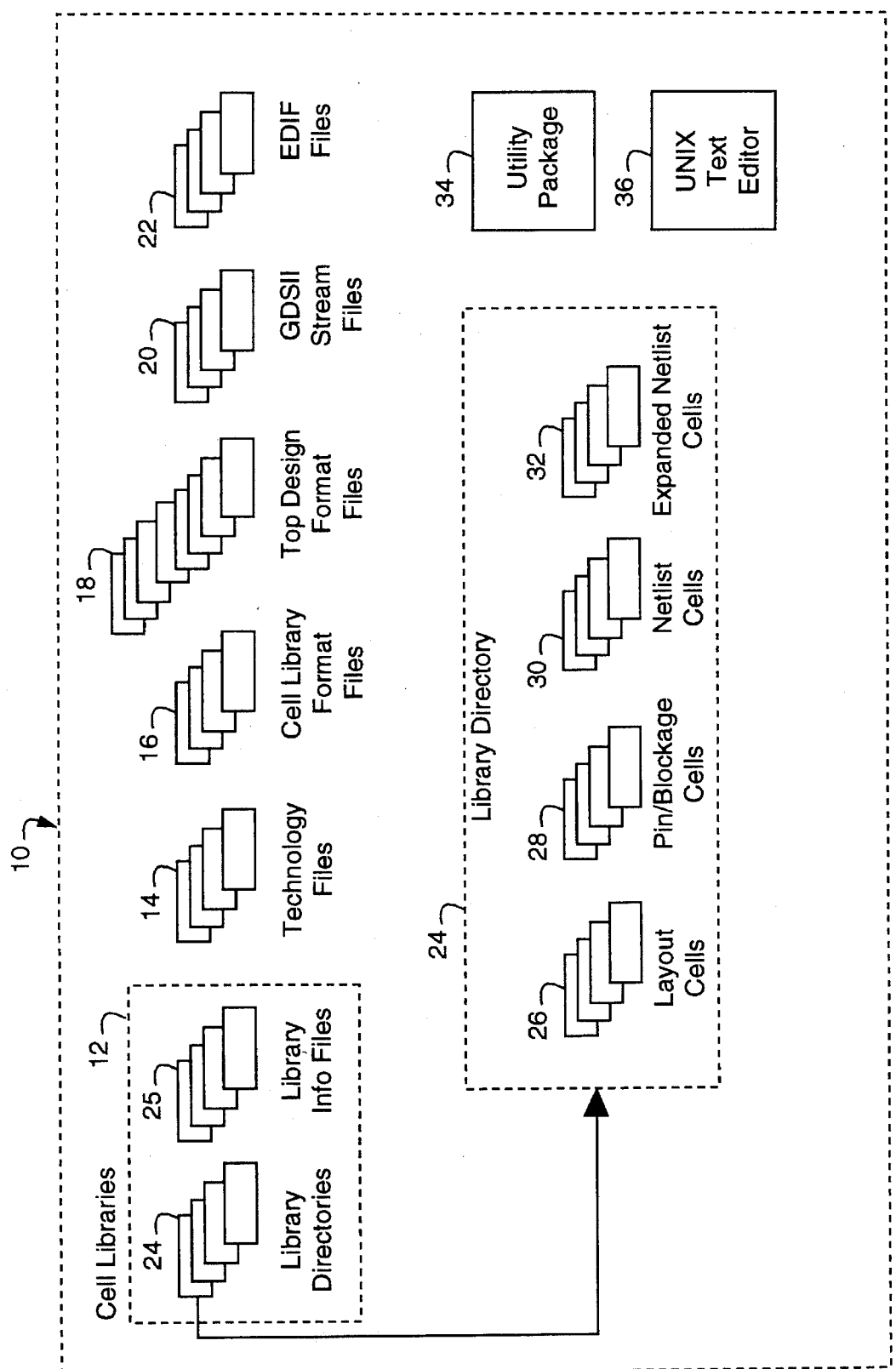
FIG. 1 is a block diagram a directory database for a cell-based place and route system embodiment of the present invention.

FIG. 1 illustrates a cell-based place and route system embodiment of the present invention, referred to by general reference numeral 10, for use with semiconductor integrated circuit (IC) designs that contain all standard cells, all blocks or a mixture of standard cells and blocks. System 10 includes in its database structure: a collection of cell libraries 12, at least one technology file 14, a plurality of cell library format files 16, a set of top design format files 18, e.g., a GDSII stream file and a EDIF file. The database of system 10 resides on a suitable computer workstation, such as are available from Sun Microsystems, Hewlett-Packard, IBM and Digital Equipment Corporation.

Cell libraries 12 include a library directory 24 which is comprised of a plurality of layout cells 26, a plurality of pin/blockage cells 28, a plurality of netlist cells 30 and a plurality of expanded netlist cells 32. Cell libraries 12 also include a library information file 25.

In operation, a user imports a physical layout for a chip-under-design with one of the GDSII files 20 and a list of the wiring interconnections between pins with one of the EDIF files 22, which is informally referred to as a "net" or "netlist".

A utility package 34 provides for library creation and preparation; GDSII stream translation; blockage, pin, and via extraction automatically or by user guidance; EDIF translation and netlist expansion.

System 10 can perform the following functions automatically, with variable user input: floor-planning, including generation of cell regions sufficient to place all standard cells; standard cell placement; power and ground net routing; global routing; detail routing and pad routing. Although these operations can be performed with very little user input, they do provide an opportunity for extensive user control. In addition, they can be used in conjunction with the manual capabilities of the system to produce the target results that are required by a user.

System 10 also preferably provides a capability to manually perform the following functions: cell region creation, block placement, pad and cell placement (before and after automatic placement), net routing before and after automatic routing and layout editing.

Verification functions included in system 10 ensure the integrity of a design after manual editing, design rule checking (DRC) and layout versus schematic (netlist) comparison (LVS).

Utility package 36 allows system 10 to prepare data for export, e.g., GDSII stream translation and EDIF translation.

Cell libraries 12 include both top-level designs and the cells used in those designs. In some cases, cells in a library can include cells from other libraries. Instead of copying cells to multiple libraries, system 10 can reference the other libraries, as "reference libraries". Each library 12 has the library directory 24 which includes two or more binary files for defining each cell in the library. The library information file 25 is a binary file that includes information compiled from technology files 14, cell library format (CLF) files 16, and the cell files 26, 28, 30 and 32 which are inside the library directory 24. Binary files are not edited. A user can, however, change the technology and CLF files 14 and 16 by using utility package 34 to unload and reload these files. When unloading one of these files, utility package 34 places the information in an editable format, so that a user can modify it using a UNIX text editor 36.

Technology files 14 define the characteristics of a cell library, such as units of measure, graphical specifications, layer and device definitions, and design rules. CLF files 16 provide system 10 with library-specific information needed to extract pins and blockage areas, align standard cells, orient pads, and perform timing-driven placement. Top design format (TDF) files 18 are provided for each top-level design in a user's library. System 10 may include at least one TDF file 18, which provides system 10 with special instructions for planning, placing, and routing a design.

System 10 can include design data files in standard formats, e.g., GDSII stream, EDIF and custom. The GDSII stream and EDIF formats are well-known industry-standard interchange formats for transporting designs between different design environments. By using utility package 34, a user can translate GDSII Stream files to or from system 10.

A representation of a design is called a cell. For any design, the possible cells include: layout cells 26, which represent the physical layout of a design; pin/blockage cells 28, which represent the pins, blockage areas (areas where no routing on a particular layer can occur), and possibly via passages (areas where vias can be placed during routing); netlist cells 30, which represent a logical connectivity of a design at a top level of hierarchy; and expanded netlist cells 32, which represent a logical connectivity of a design at enough levels of hierarchy to provide information necessary for binding with a physical layout. Other files, such as backup files, may be created as a user works with system 10.

Figure 2A:
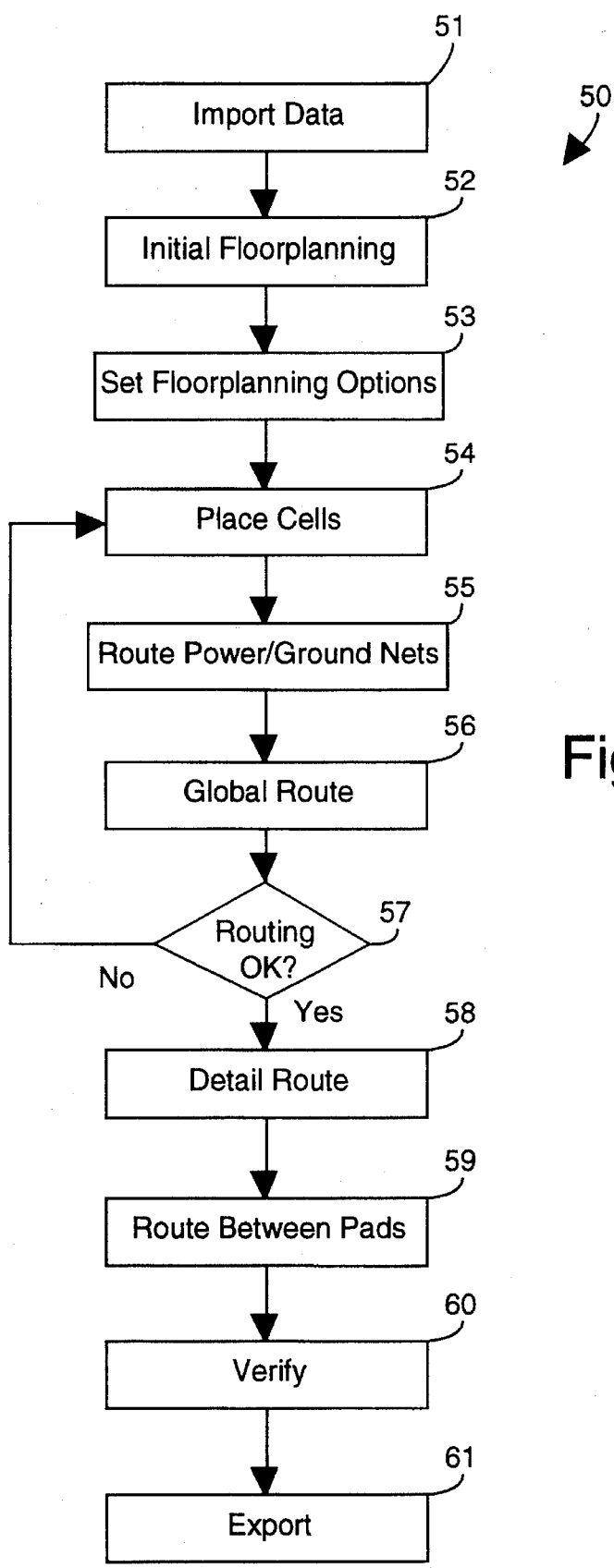
FIG. 2A represents an exemplary high-level design flow for a single-region design comprising only standard cells.

FIG. 2A represents an exemplary high-level design flow 50 for a single-region design comprising only standard cells. Data is imported in a step 51. A step 52 does an initial floor-planning. A step 53 sets the floor-planning options. Cells are placed in a step 54. Power and ground nets are routed in a step 55. A global route is then done in a step 56. A step 57 checks the result of the routing. A detail route is done in a step 58. A route between pads is done in a step 59. The results are verified in a step 60. The results are exported in a step 61, concluding process 50.

Figure 2B:
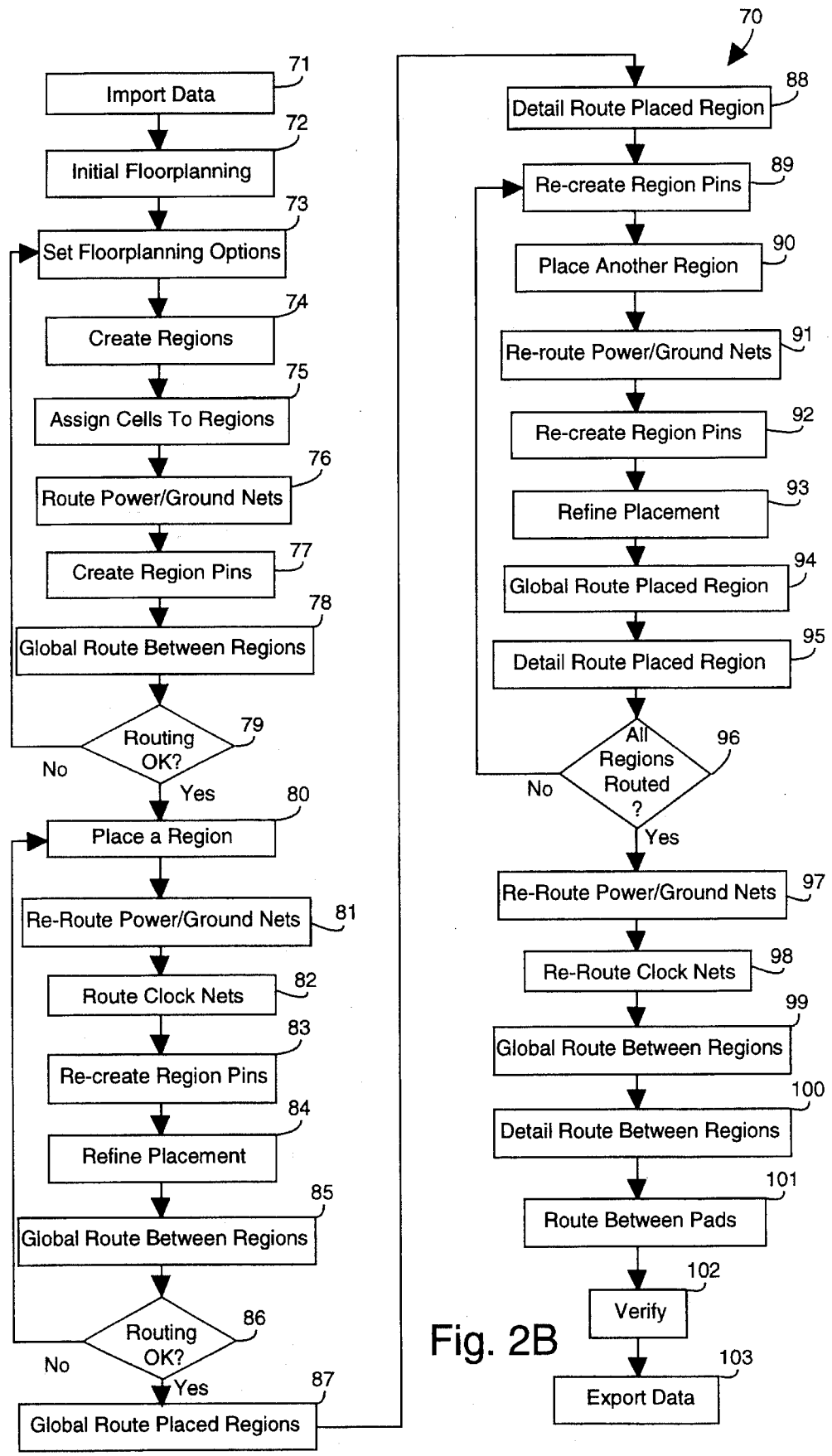
FIG. 2B represents an exemplary high-level design flow for a multiple-region design comprising both blocks and standard cells.

FIG. 2B represents an exemplary high-level design flow 70 for a multiple-region design comprising both blocks and standard cells. Data is imported in a step 71. A step 72 does an initial floor-planning. A step 73 sets the floor-planning options. Regions are created in a step 74. Cells are assigned to regions in a step 75. Power and ground nets are routed in a step 76. Region pins are created in a step 77. A global route between regions is then done in a step 78. A step 79 checks the result of the routing. Steps 78 and 79 may be omitted. A region is placed in a step 80. The power and ground nets are re-routed in a step 81. Clock nets are routed in a step 82. Region pins are re-created in a step 83. The placement is refined in a step 84. A global route between regions is done in a step 85. A step 86 checks to see if the routing was acceptable. Steps 85 and 86 are optional, and may be omitted. A step 87 does a global route between regions. A detail route between regions is done in a step 88. Region pins are re-created in a step 89. Another region is placed in a step 90. Power and ground nets are re-routed in a step 91. Region pins are re-created in a step 92. The placement is refined in a step 93. A global route between the placed regions is done in a step 94. A detail route between placed regions is done in a step 95. A step 96 checks to see if all regions have been routed. If so, a step 97 re-routes the power and ground nets. The clock nets are re-routed in a step 98. A global route between regions is done in a step 99. A detail route between regions is done in a step 100. A route between pads is done in a step 101. The end result is verified in a step 102. The results are exported in a step 103, thus concluding process 70.

A design rule section is included within the technology files 14 to define the particular design rules that apply to designs in a library. All measurements are in units that have been specified by a user. The minimum width allowed for an object on a layer is also specified. A typical design rule section of technology files 14 can read:

*designRule
  minSpacing v1 cont 1.6
  minEnclosure m2 v1 0.75
  condSpacing m1 20 10 yes
  rowSpacing top bottom 10 yes
*end.

The design rules are preferably defined in the following format:

*designRule {ruleType ruleAttributes} . . .
*end,
where:
  "ruleType" specifies the type of rule being defined, with valid values of:
    "minSpacing", which defines the minimum distance required between objects on different layers (when the objects are on different nets);
    "condSpacing", which defines the minimum distance required between wires on the same layer (but different nets) with widths greater than or equal to a specified value;
    "minEnclosure", which defines the minimum distance by which a layer must enclose another layer when the two layers overlap; and
    "rowSpacing", which defines the minimum distance required between adjacent cell rows that are not abutted and specifies whether or not system 10 can abut cell rows.
  "ruleAttributes" for attributes of the rule, with valid values that depend on the "rule Type".

If the "ruleType" is "minSpacing" the "ruleAttributes" is defined, "layer1 layer2 distance" where:
  "layer1" is a first layer to which a rule applies, with valid values that are name or number of a layer defined by a "layerTable";
  "layer2" is the other layer to which a rule applies, with valid values being the name or number of a layer defined by "layerTable" (must be different than layer1);

and

"distance" is a minimum distance required between an object on layer1 and an object on layer2 (when the objects are on different nets).

Objects on the same netlist have an implicit minimum spacing of zero. Alternatively, system 10 supports a user-specified minimum spacing rule for objects that share the same net.

If a "ruleType" is "minEnclosure", a user defines the "ruleAttributes" as, "layer1 layer2 distance", where the arguments are:

"layer1", which is the enclosing layer to which the rule applies, with valid values that are the name or number of a layer defined by layerTable, and must be different than for layer2;

"layer2" which is the enclosed layer to which the rule applies, with valid values of the name or number of a layer defined by layerTable, and must be different than layer1; and "distance" is the minimum distance by which layer1 must enclose layer2 if the two layers overlap.

For example, a "minEnclosure" rule entered "minEnclosure m2 m1 0.75", instructs system 10 that when a metal two (m2) layer overlaps a metal one (m1) layer, the relative positions and sizes of objects are such that the m2 layer is to extend beyond and outside the m1 layer by at least 0.75 user units.

If the "ruleType" is "condSpacing", a user defines the "ruleAttributes" as, "layer threshold newSpacing checkThinWire?", where the arguments are:

"layer", which is the layer to which the rule applies, with valid values of the name or number of a layer defined by "layerTable";

"threshold", which is the minimum wire width to which the fat wire spacing rule applies;

"newSpacing", which is the minimum distance required between wires with a width greater than or equal to threshold on a specified layer; and "checkThinWire?", which conditions wide wire spacing rules to be applied when only one of the wires exceeds a threshold, with valid values of, "yes" to apply the rule when either wire exceeds a threshold, and "no" to apply the rule only when both wires exceed a threshold.

If the "ruleType" is "rowSpacing", a user defines the "ruleAttributes" as "edge1 edge2 minSpacing abut?", where the arguments are:

"edge1", which specifies the first cell row edge to which the rule applies, with valid values of "top" and "bottom";

"edge2", which specifies the second cell row edge to which the rule applies, with valid values of "top" and "bottom";

"minSpacing", which specifies the minimum distance required between "edge1" and "edge2" when these edges are adjacent and the rows are not abutted; and "abut?", which specifies whether or not "edge1" and "edge2" can be abutted, with valid values, "yes", which means that system 10 may abut "edge1" and "edge2", and "no", which specifies that system 10 may not abut "edge1" and "edge2".

For double-back cell rows in a floor-plan, a user specifies a row spacing rule, either (1) "between top edge and top edge", or (2) "between bottom edge and bottom edge". When not using double-back cell rows in a floor-plan, a user would specify, "between top edge and bottom edge".

Figure 3:
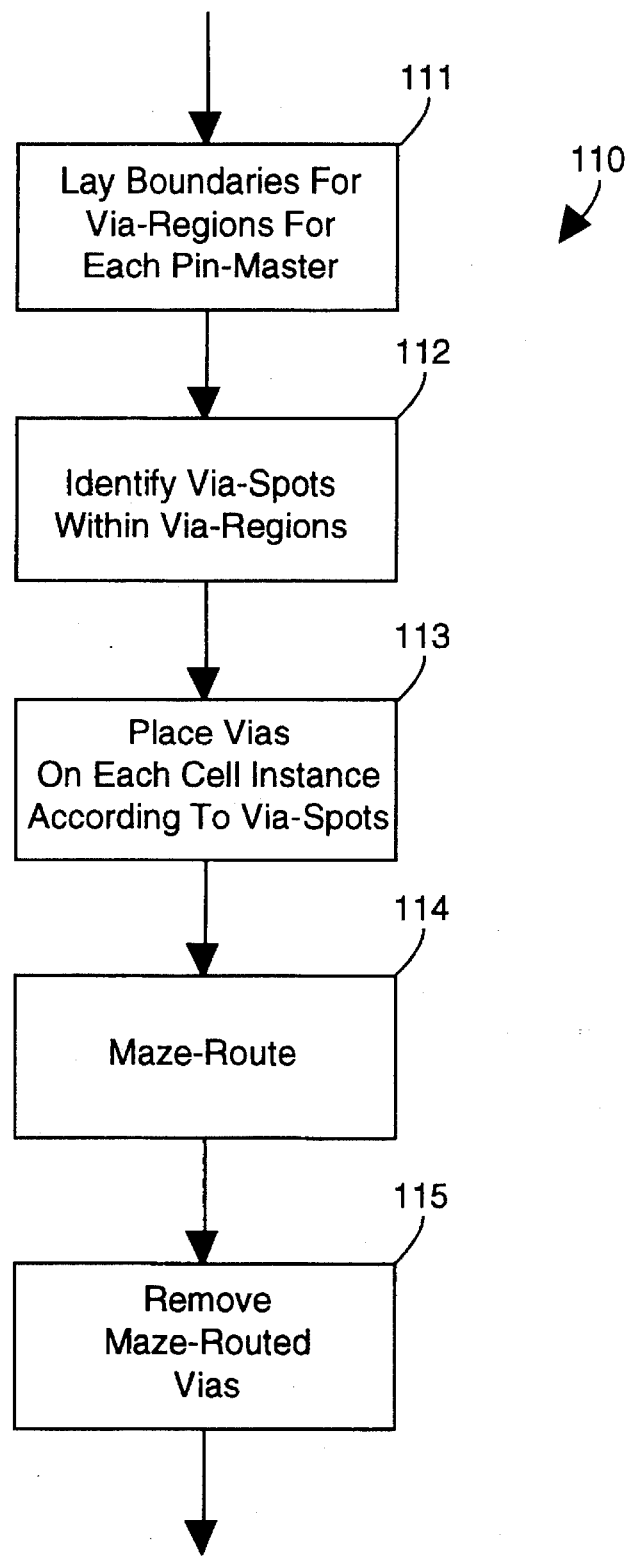
FIG. 3 represents a five-step electronic design automation tool method for the design of a chip with at least two metal interconnecting layers (metal-1 and metal-2).

FIG. 3 illustrates a process 110 included in an electronic design automation tool for the design of a chip with at least two metal interconnecting layers (metal-1 and metal-2). A step 111 comprises laying boundaries for a via-region on the chip for each pin-master in a plurality of pin-masters within a cell-master, wherein placing a via connects a pin to a metal-2 layer without causing a predefined design rule violation to any other pin-master. A step 112 comprises identifying at least one "via-spot" within each of the via-regions that will violate none of the design rules if vias are placed at these points. A first attempt at identification will inspect points along metal-2-pitch lines and half metal-2-pitch lines in the via-region. The via-spots which have a maximum number of spots on metal-2-pitch lines and half metal-2-pitch lines are preferred. If the via region is empty for the pin master, vertical wires which will not cause design rule violations to other pins are added at the metal-2 pitch or one-half the metal-2 pitch position and vias are placed at the end of the wires to allow a direct access of the pin by the router. A step 113 comprises placing vias on each cell instance according to their via-spots, such that for each cell instance, a two via-spot combination associated with it's cell-master is found where a first combination (c1) has a maximum number of via-spots (n1) on metal-2-pitch lines and a second combination (c2) has a maximum number of via-spots (n2) on half-metal-2-pitch lines. If n1 is greater than or equal to n2, then vias are placed at the via-spots defined by c1. Otherwise, the cell instance is shifted, e.g., left, and the vias are placed at the via-spots defined by c2. A step 114 comprises conventional maze-routing to connect the neighboring same net pins by metal-1. A step 115 comprises removing the vias on the pins connected by the maze-routing, leaving only one via on a pin if a connection for a current net is not complete. In cases where a via spot cannot be found automatically, a manual addition of the via spots is possible with the editor.

Although the present invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A computer-implemented method of providing an electronic design automation tool for the design of a chip with at least two metal interconnecting layers (metal-1 and metal-2), said chip design being introduced to a database in a computer workstation by a user in a set of top design files and extracted in exportable form by a utility package, the method comprising the steps of:

accessing said computer database for laying boundaries for a via-region on said chip for each pin-master in a plurality of pin-masters all in a cell-master, wherein placing a via connects a pin to a plurality of metal layers without causing a pre-defined design rule violation to any other pin-master;

accessing said computer database for identifying all "via-spots" within each said via-region that violates none of said design rules if vias are placed at these points, wherein a first attempt at identification inspects points along metal-2-pitch lines and half metal-2-pitch lines in said via-region, and wherein said via-spots which have a maximum number of spots on metal-2-pitch lines and half metal-2-pitch lines are preferred;

accessing said computer database for placing vias on each cell instance according to their via-spots, such that for each cell instance, a two via-spot combination associated with it's cell-master is found where a first combination (c1) has a maximum number of via-spots (n1) on metal-2-pitch lines and a second combination (c2) has a maximum number of via-spots (n2) on half-metal-2-pitch lines, and if n1 is greater than or equal to n2, then vias are placed at said via-spots defined by c1, otherwise said cell instance is shifted, and said vias are placed at said via-spots defined by c2;

accessing said computer database for maze-routing to connect said neighboring same net pins by metal-1; and accessing said computer database for removing said vias on said pins connected by the maze-routing, leaving only one via on a pin if a connection for a current net is not complete.

2. The method of claim 1, wherein:

accessing said computer database for the laying of boundaries step is such that for each pin-master in a cell-master, a region is extracted and a pin access direction is identified by a program in which placing a via connection to a pin and metal layers allows direct access of pins from top or bottom and cause no design rule violations to any other pin-masters, and wherein the region is physically bounded on the surface of a chip, such region being a "via-region" on a pin-master, and further, if the via region is empty for a pin-master, vertical wires that do not cause design rule violations to other pins are added at a metal-2 pitch or one-half a metal-2 pitch position and vias and are placed at the ends of the wires to allow a direct access of said pin by a router.

3. A computer-implemented design flow method for a semiconductor chip with a single-region design comprising only standard cells, the method comprising the steps of:
 a. importing data including a netlist and physical cell information for said chip design into a computer database;
 b. initial floor-planning of said chip design in said database;
 c. setting floor-planning options of said chip design in said database;
 d. placing cells on said chip design in said database;
 e. routing power and ground nets on said chip design in said database;
 f. global routing said netlists in said database;
 g. checking the result of said routing and returning to the step of placing cells if said routing was not acceptable;
 h. detail routing said netlists in said database;
 i. routing between pads of said cells in said database;
 j. verifying said routing in said database; and
 k. exporting a resulting design for fabrication of said chip design from said database.

4. A computer-implemented design flow method for a semiconductor chip with a multiple-region design comprising only standard cells, the method comprising the steps of:
 a. importing data including a netlist and physical cell information into a database in a computer;
 b. initial floor-planning of said chip design in said database;
 c. setting floor-planning options for said chip design in said database;
 d. creating a plurality of regions for said chip design in said database;
 e. assigning a plurality of cells to said regions;
 f. routing power and ground nets on said chip design in said database;
 g. creating region pins for said chip design in said database;
 h. placing a region on said chip design in said database;
 i. re-routing said power and ground nets for said chip design in said database;
 j. routing at least one clock net on said chip design in said database;
 k. re-creating said region pins for said chip design in said database;
 l. refining a current placement of regions for said chip design in said database;
 m. global routing between said placed regions for said chip design in said database;
 n. detail routing between said placed regions for said chip design in said database;
 o. re-creating region pins for said chip design in said database;
 p. placing another region for said chip design in said database;
 q. re-routing said power and ground nets for said chip design in said database;
 r. re-creating said region pins for said chip design in said database;
 s. refining a current placement for said chip design in said database;
 t. global routing between said placed regions for said chip design in said database;
 u. detail routing between said placed regions for said chip design in said database;
 v. checking the result of said routing and returning to the step of placing a region if said routing was not acceptable;
 w. re-routing said power and ground nets for said chip design in said database;
 x. re-routing said clock nets for said chip design in said database;
 y. global routing between said placed regions for said chip design in said database;
 z. detail routing between said placed regions for said chip design in said database;
 aa. routing between a plurality of pads on said chip design in said database;
 bb. verifying said routing for said chip design in said database; and
 cc. exporting a resulting design for fabrication of said chip from said database.

5. The method of claim 4, further including between the steps of (g) and (h), the steps of:
 global routing between said regions for said chip design in said database; and
 checking the result of said routing and returning to the step of setting floor-planning options if said routing was not acceptable for said chip design in said database.

6. The method of claim 4, further including between the steps of (l) and (m), the steps of:

global routing between said regions for said chip design in said database; and checking the result of said routing and returning to the step of setting floor-planning options if said routing was not acceptable for said chip design in said database.

7. A computer implemented design flow method for place and route on a computer workstation of a design for a semiconductor chip with a multiple-region design comprising only standard cells provided as a physical layout and netlist in a set of top design EDIF and GDSII files to said database, the method comprising the steps of processing said database for sequentially:

a. importing data including a netlist and physical cell information;
b. initial floor-planning of said chip;
c. setting floor-planning options;
d. creating a plurality of regions;
e. assigning a plurality of cells to said regions
f. routing power and ground nets on said chip;
g. creating region pins;
h. global routing between said regions;
i. checking the result of said routing and returning to the step of setting floor-planning options if said routing was not acceptable;
j. placing a region on said chip;
k. re-routing said power and ground nets;
l. routing at least one clock net on said chip;
m. re-creating said region pins;
n. refining a current placement of regions;
o. global routing between regions;
p. checking the result of said routing and returning to the step of placing a region if said routing was not acceptable;
q. global routing between said placed regions;
r. detail routing between said placed regions;
s. re-creating region pins;
t. placing another region;
u. re-routing said power and ground nets;
v. re-creating said region pins;
w. refining a current placement;
x. global routing between said placed regions;
y. detail routing between said placed regions;
z. checking the result of said routing and returning to the step of placing a region if said routing was not acceptable;
aa. re-routing said power and ground nets;
bb. re-routing said clock nets;
cc. global routing between said placed regions;
dd. detail routing between said placed regions;
ee. routing between a plurality of pads on said chip;
ff. verifying said routing; and
gg. exporting a resulting design for fabrication of said chip.

8. An electronic design automation tool for the design of a chip with at least two metal interconnecting layers (metal-1 and metal-2), that are used in a later fabrication of the chip with conventional semiconductor manufacturing techniques, comprising:

a database structure including interconnected and inter-related cell libraries, at least one technology file, cell library format files, and top design format files all related to said chip design, wherein said database resides on a computer workstation;

computer boundary means connected to the database for laying boundaries for a via-region on said chip for each pin-master in a plurality of pin-masters all in a cell-master, wherein placing a via connects a pin to a plurality of metal layers without exceeding any of a set of a pre-defined design rules included in said database to any other pin-master;

computer identification means connected to the computer boundary means for identifying all "via-spots" within each said via-region that violates none of said design rules if vias are placed at these points, wherein a first attempt at identification inspects points along metal-2-pitch lines and half metal-2-pitch lines in said via-region, and wherein said via-spots which have a maximum number of spots on metal-2-pitch lines and half metal-2-pitch lines are preferred;

computer placement means connected to the computer identification means for placing vias on each cell instance according to their via-spots, such that for each cell instance, a two via-spot combination associated with it's cell-master is found where a first combination (c1) has a maximum number of via-spots (n1) on metal-2-pitch lines and a second combination (c2) has a maximum number of via-spots (n2) on half-metal-2-pitch lines, and if n1 is greater than or equal to n2, then vias are placed at said via-spots defined by c1, otherwise said cell instance is shifted, and said vias are placed at said via-spots defined by c2;

computer routing means connected to the computer placement means for maze-routing to connect said neighboring same net pins by metal-1; and computer removal means connected to the computer routing means for removing said vias on said pins connected by the maze-routing, leaving only one via on a pin if a connection for a current net is not complete.

9. The tool of claim 8, wherein:

the computer boundary means is such that for each pin-master in a cell-master, a region is extracted and a pin access direction is identified by a program in which placing a via connection to a pin and metal layers allows direct access of pins from top or bottom and cause no design rule violations to any other pin-masters, and wherein the region is physically bounded on the surface of a chip, such region being a "via-region" on a pin-master, and further, if the via region is empty for a pin-master, vertical wires that do not cause design rule violations to other pins are added at a metal-2 pitch or one-half a metal-2 pitch position and vias and are placed at the ends of the wires to allow a direct access of said pin by a router.

10. A design tool for creating a semiconductor chip with a single-region design comprising only standard cells, comprising:

a database structure including interconnected and inter-related cell libraries, at least one technology file, cell library format files, and top design format files all related to said chip design, wherein said database resides on a computer workstation with interconnected computer-implemented processes for sequentially:

a. importing data including a netlist and physical cell information;
b. initial floor-planning of said chip;
c. setting floor-planning options;
d. placing cells on said chip;
e. routing power and ground nets on said chip;
f. global routing said netlists;
g. checking the result of said routing and returning to the step of placing cells if said routing was not acceptable;
h. detail routing said netlists;
i. routing between pads of said cells;
j. verifying said routing; and
k. exporting a resulting design for fabrication of said chip back to a file in said database for read out by a user.

11. A design tool for creating a semiconductor chip with a multiple-region design comprising only standard cells, comprising:

a database structure including interconnected and inter-related cell libraries, at least one technology file, cell library format files, and top design format files all related to said chip design, wherein said database resides on a computer workstation with interconnected computer-implemented processes for sequentially:
a. importing data including a netlist and physical cell information;
b. initial floor-planning of said chip;
c. setting floor-planning options;
d. creating a plurality of regions;
e. assigning a plurality of cells to said regions
f. routing power and ground nets on said chip;
g. creating region pins;
h. placing a region on said chip;
i. re-routing said power and ground nets;
j. routing at least one clock net on said chip;
k. re-creating said region pins;
l. refining a current placement of regions;
m. global routing between said placed regions;
n. detail routing between said placed regions;
o. re-creating region pins;
p. placing another region;
q. re-routing said power and ground nets;
r. re-creating said region pins;
s. refining a current placement;
t. global routing between said placed regions;
u. detail routing between said placed regions;
v. checking the result of said routing and returning to the step of placing a region if said routing was not acceptable;
w. re-routing said power and ground nets;
x. re-routing said clock nets;
y. global routing between said placed regions;
z. detail routing between said placed regions;
aa. routing between a plurality of pads on said chip;
bb. verifying said routing; and
cc. exporting a resulting design for fabrication of said chip back to a file in said database for read out by a user.

12. The tool of claim 11, further including between the interconnected computer-implemented sequential steps of (g) and (h), the interconnected computer-implemented sequential steps of:

global routing between said regions; and
checking the result of said routing and returning to the step of setting floor-planning options if said routing was not acceptable.

13. The tool of claim 12, further including between the interconnected computer-implemented sequential steps of (l) and (m), the interconnected computer-implemented sequential steps of:

global routing between said regions; and
checking the result of said routing and returning to the step of setting floor-planning options if said routing was not acceptable.

14. A design tool for creating a semiconductor chip with a multiple-region design comprising only standard cells, comprising:

a database structure including interconnected and inter-related cell libraries, at least one technology file, cell library format files, and top design format files all related to said chip design, wherein said database resides on a computer workstation with interconnected computer-implemented processes for sequentially:
a. importing data including a netlist and physical cell information;
b. initial floor-planning of said chip;
c. setting floor-planning options;
d. creating a plurality of regions;
e. assigning a plurality of cells to said regions;
f. routing power and ground nets on said chip;
g. creating region pins;
h. global routing between said regions;
i. checking the result of said routing and returning to the step of setting floor-planning options if said routing was not acceptable;
j. placing a region on said chip;
k. re-routing said power and ground nets;
l. routing at least one clock net on said chip;
m. re-creating said region pins;
n. refining a current placement of regions;
o. global routing between regions;
p. checking the result of said routing and returning to the step of placing a region if said routing was not acceptable;
q. global routing between said placed regions;
r. detail routing between said placed regions;
s. re-creating region pins;
t. placing another region;
u. re-routing said power and ground nets;
v. re-creating said region pins;
w. refining a current placement;
x. global routing between said placed regions;
y. detail routing between said placed regions;
z. checking the result of said routing and returning to the step of placing a region if said routing was not acceptable;
aa. re-routing said power and ground nets;
bb. re-routing said clock nets;
cc. global routing between said placed regions;
dd. detail routing between said placed regions;
ee. routing between a plurality of pads on said chip;
ff. verifying said routing; and
gg. exporting a resulting design for fabrication of said chip to said database for read out by a user.

* * * * *